United States Patent [19]

Heppler

[11] Patent Number: 5,348,164
[45] Date of Patent: Sep. 20, 1994

[54] METHOD AND APPARATUS FOR TESTING INTEGRATED CIRCUITS

[75] Inventor: Steve W. Heppler, Kuna, Id.

[73] Assignee: Micron Semiconductor, Inc., Boise, Id.

[21] Appl. No.: 46,246

[22] Filed: Apr. 13, 1993

[51] Int. Cl.$^5$ .............................................. B07C 5/344
[52] U.S. Cl. .................................... 209/573; 209/911; 324/158.1
[58] Field of Search ............... 209/552, 559, 571, 573, 209/574, 575, 655, 911; 324/158 F; 198/346.2, 346.3, 360

[56] References Cited

U.S. PATENT DOCUMENTS

| | | | |
|---|---|---|---|
| 4,691,831 | 9/1987 | Suzuki et al. | 209/573 |
| 4,733,459 | 3/1988 | Tateno | 209/573 X |
| 4,805,779 | 2/1989 | Heigl | 209/573 |
| 4,976,356 | 12/1990 | Mizuno et al. | 209/655 X |
| 5,230,432 | 7/1993 | Sugai | 209/573 X |
| 5,261,775 | 11/1993 | Kobayashi | 324/158 F X |

FOREIGN PATENT DOCUMENTS 55-27955  2/1980  Japan .................... 209/573

OTHER PUBLICATIONS

Welcon Sockets and Connectors, Wells Electronics, Inc. 1701 S. Main St., South Bend, Ind., 46613 1991.

Primary Examiner—D. Glenn Dayoan
Assistant Examiner—Tuan N. Nguyen
Attorney, Agent, or Firm—Michael W. Starkweather

[57] ABSTRACT

There is an IC (integrated circuit) testing device 11 that receives singulated ICs from a singulation station's bottom table 44, where an IC 15 has slid down onto loading ramp or track 16. The IC will slide into test station 18, where stop pin 22 has been inserted to stop the IC in DUT (device under test) station 20. In the DUT station, the IC is securely held in position by an extractor bar 26, insertion bar 28, and a part guide 24. Thereby, test cite station 18 will move downward and insert IC 15 into testing socket 30. After testing the IC, testing station 18 returns upward with the IC in the same secured position. Pin 22 will be removed to allow the IC to slide into part holding station 31. If the IC was not defective, pin 32 will be removed to allow the IC to slide onto track 36 of the IC separator station 34. While the test cite station 18 is in the up position a second IC is slid along track 16 and loaded into DUT cite 20 being readied for the next test cycle. However, if the first IC was found to be defective, pin 32 will be positioned so as to stop the IC from sliding onto track 36. Thereby, the test cite 18 will proceed to the down position to test the second IC, and simultaneously pin 32 will be removed to now allow the defective IC to slide onto track 38. The second IC has now completed its testing and is ready to proceed to the remainder of the cycle.

6 Claims, 4 Drawing Sheets

METHOD AND APPARATUS FOR TESTING INTEGRATED CIRCUITS

FIELD OF THE INVENTION

The present invention relates to integrated circuits ICs). Particularly, this invention relates to IC quality testing equipment. Uniquely, there is a method and device that can detect defective ICs that are coming off of an IC singulation station or work process.

BACKGROUND OF THE INVENTION

FIG. 1 illustrates a representative portion of a semiconductor chip trim and pin forming machine. One can purchase such a machine from ASM Asia Inc., 4302 E. Broadway Rd., Phoenix, Ariz., model AP50, or from Precision Technologies Inc. 1725 De La Cruz Blvd. #4, Santa Clara, Calif. 95050, models Matrix SS, FS, or FM. FIG. 1 identifies the following elements: Platen 40 is the portion of the press-type machine to moved up and down to stamp in the desired forming and trimming operations. Vertical action rod 42 is attached to a means for moving platen 40 into contact with the non movable table 44. IC forming and cutting die 44 are mounted to both the platen 40 and table 44. IC loading station 50 receives a set of ICs usually from the plastic encapsulation station and they are attached on a typical single leadframe. Trim stations 60 will trim off the excess encapsulation material and metal leadframe portions. Forming stations 70 will bend the leads of the ICs into various configurations like "SOJ" or DIP. Singulation station 80 will completely separate the ICs from the leadframe to become single packages or devices 10.

One skilled in the art will be familiar with the operation of the machine and its variations. Specifically, all processes or work station activities take place on a paced operation which is timed to the platen's 40 up and down cycles. When platen 40 is up, the conveyor system will move the leadframe/s forward, readying the ICs for their next step of operation or simply loading new leadframes in preparation for the assembly process. When the platen 40 is "punched down", the various work stations perform their various designed operations, cutting, shaping, cleaning, separating etc.

After the ICs have been separated, they are collected and forwarded to subsequent work stations. Such as lead finishing or solder coating, primary testing involving a large amount of tests and expensive slow equipment, and acceptable quality level tests examining for physical defects in the packages/ICs. Thereafter, the ICs are tested to determine which ones are defective.

PROBLEM

After an IC has been singulated or separated from the other ICs, there is still remaining a lot of work or investment that need to be put into each IC before they are completely done. However, there are many defects that could have already occurred up to the point of singulating the ICs. Typically, the ICs are tested for defects after completing the full production process occurring well after the singulation stage. A few of the main reasons for testing so late in the production cycle is that the typical tests performed are costly and time consuming. There has not been any known method of or device for testing the ICs immediately after singulation of the ICs. Such a testing system would undoubtedly save a great deal of time and money by not working on identified defective ICs.

It is noted that the above described problems, as well as other problems, are solved through the subject invention and will become more apparent, to one skilled in the art, from the detailed description of the subject invention.

SUMMARY OF THE INVENTION

The invention is a method and an apparatus for controlling positioning of circuit before, during and after a circuit One skilled in the art will appreciate the advantage of the method of and device for testing the ICs immediately after singulation of the ICs. Specifically, there is a method of and device for receiving the singulated ICs and performing tests to separate defective ICs from the rest of the ICs.

Other features and advantages of the present invention may become more clear from the following detailed description of the invention, taken in conjunction with the accompanying drawings and claims, or may be learned by the practice of the invention.

Figure 1:
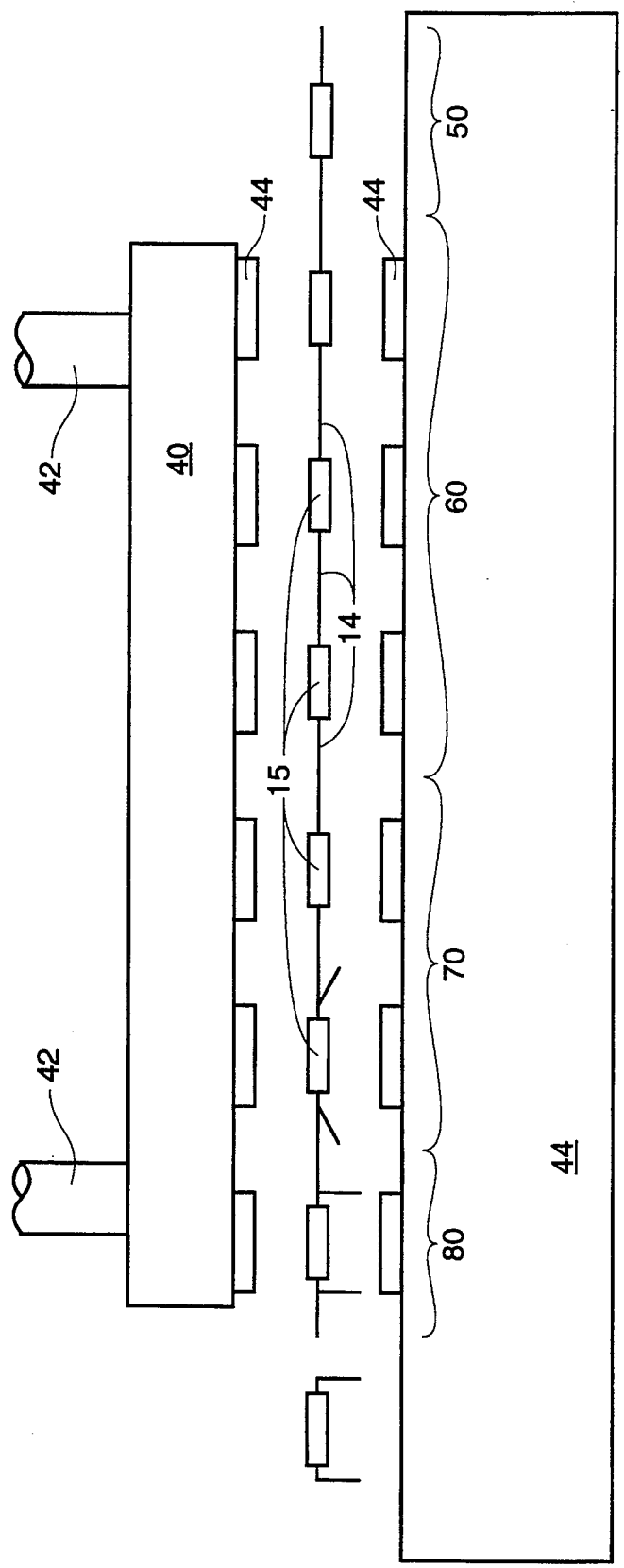
FIG. 1 is a related art illustration.

It is noted that the drawings of the invention are not to scale. The drawings are merely schematic representations, not intended to portray specific parameters of the invention. The drawings are intended to depict only typical embodiments of the invention, and are therefore not robe considered limiting of its scope. The invention will be described with additional specificity and detail through the use of the accompanying drawings. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arts" (Article 1, Section 8 of the U.S. Constitution).

GENERAL EMBODIMENT

Figure 2:
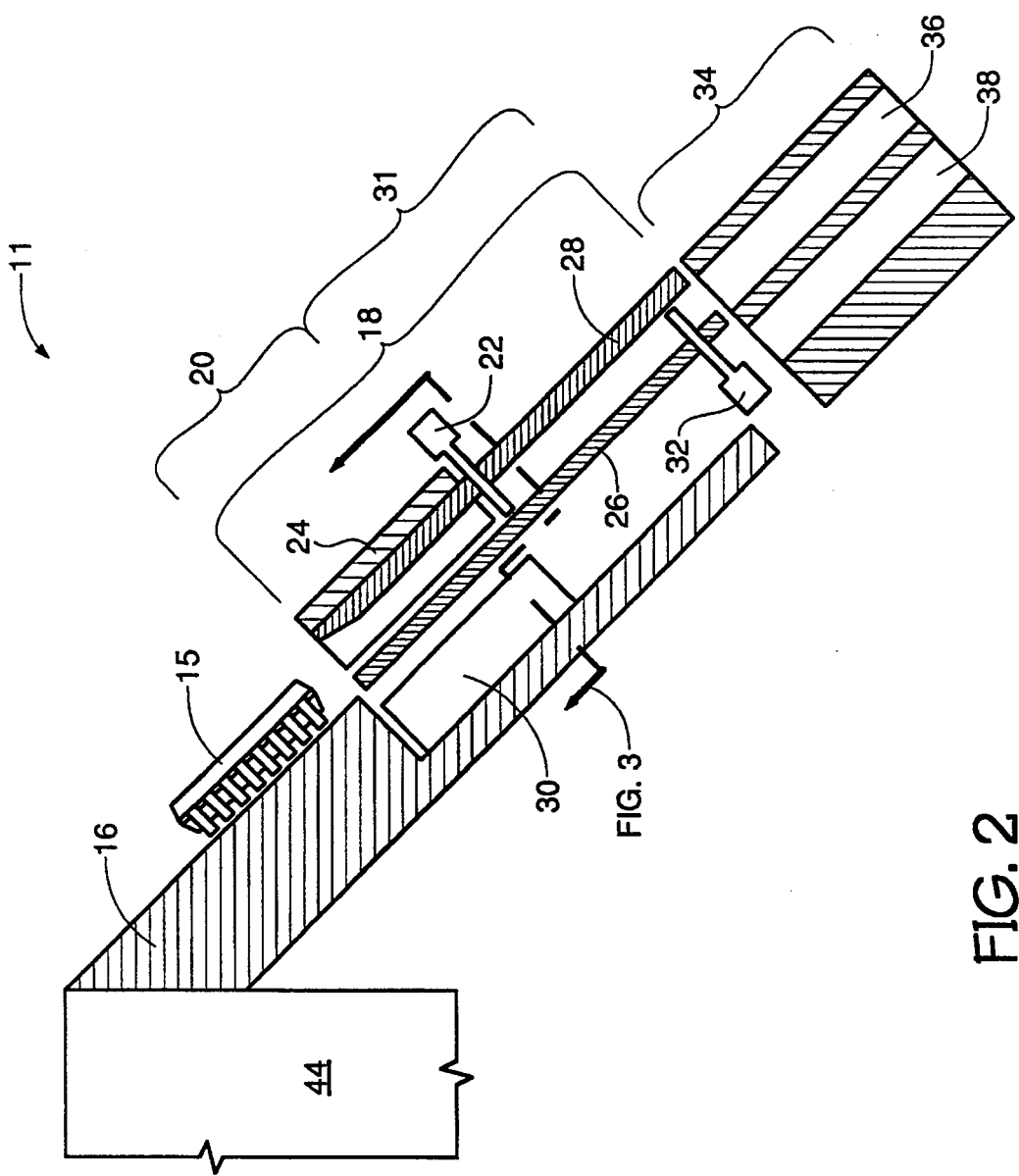
FIG. 2 is a general overall view of the invention.

Referring to FIG. 2, there is a sectional side view of the IC testing device 11 comprising the following elements: There is a portion of a singulation station's bottom table 44, where an IC 15 has slid down onto loading ramp or track 16. The IC will slide into testing station 18, where stop pin 22 has been inserted to stop the IC in DUT (device under test) station 20. In the DUT station, the IC is securely held in position by an extractor bar 2, insertion bar 28, and a part guide 24. Thereby, test cite station 18 will move downward and insert IC 15 into testing socket 30. Typical testing sockets can be purchased from Wells Electronics, Inc. 1701 S. Main St., South Bend, IN 46613. After testing the IC, testing station 18 returns upward with the IC in the same secured position. Pin 22 will be removed to allow the IC to slide into part holding station 31. If the IC was not defective, pin 32 will be removed to allow the IC to slide onto track 36 of the IC separator station 34. While the test cite station 18 is in the up position a second IC is slid along track 16 and loaded into DUT cite 20 being readied for the next test cycle. However, if the first IC was found to be defective, pin 32 will be positioned so as to stop the IC from sliding onto track 36. Thereby, the test cite 18 will proceed to the down position to test the second IC, and simultaneously pin 32 will be removed to now allow the defective IC to slide onto track 38. The second IC has now completed its testing and is ready to proceed to the remainder of the cycle.

Figure 3:
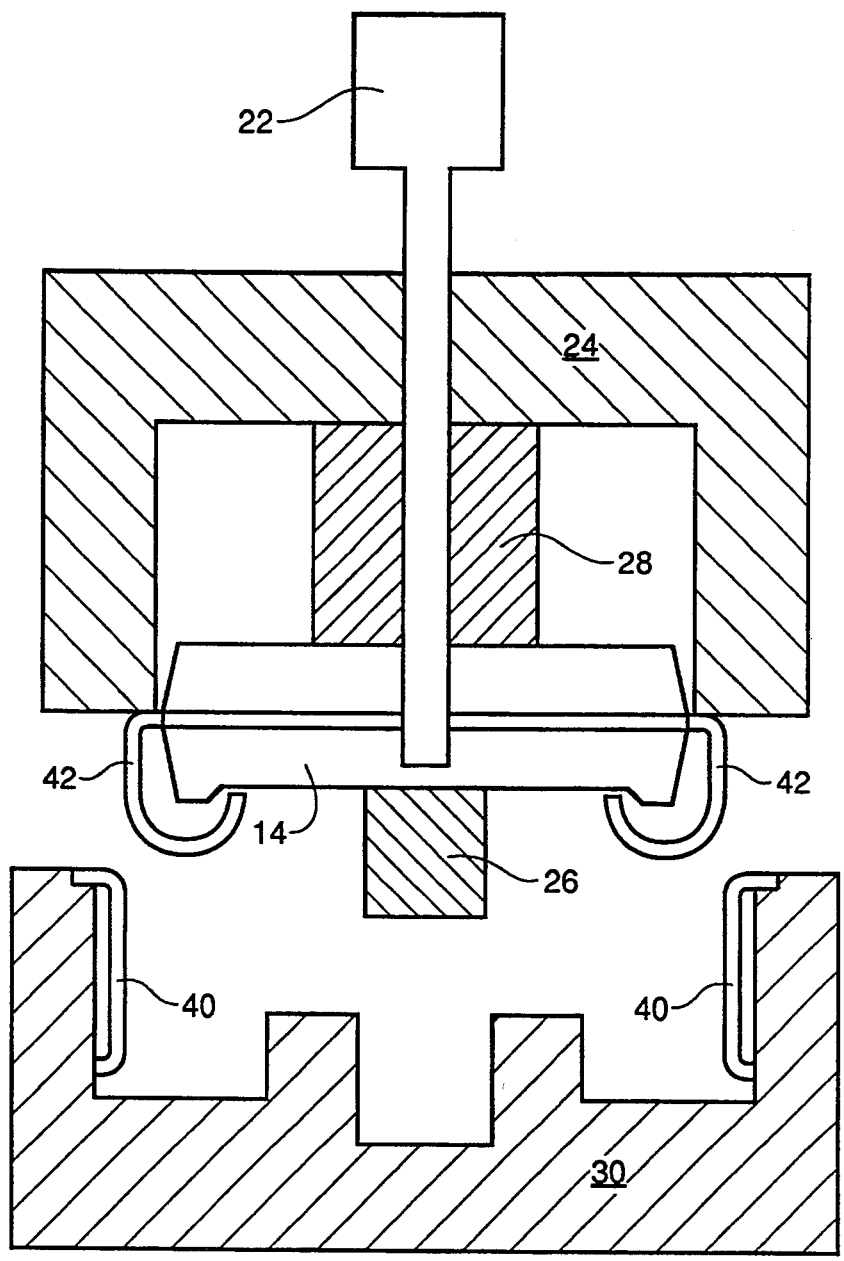
FIG. 3 is a detailed illustration of the invention.
Figure 4:
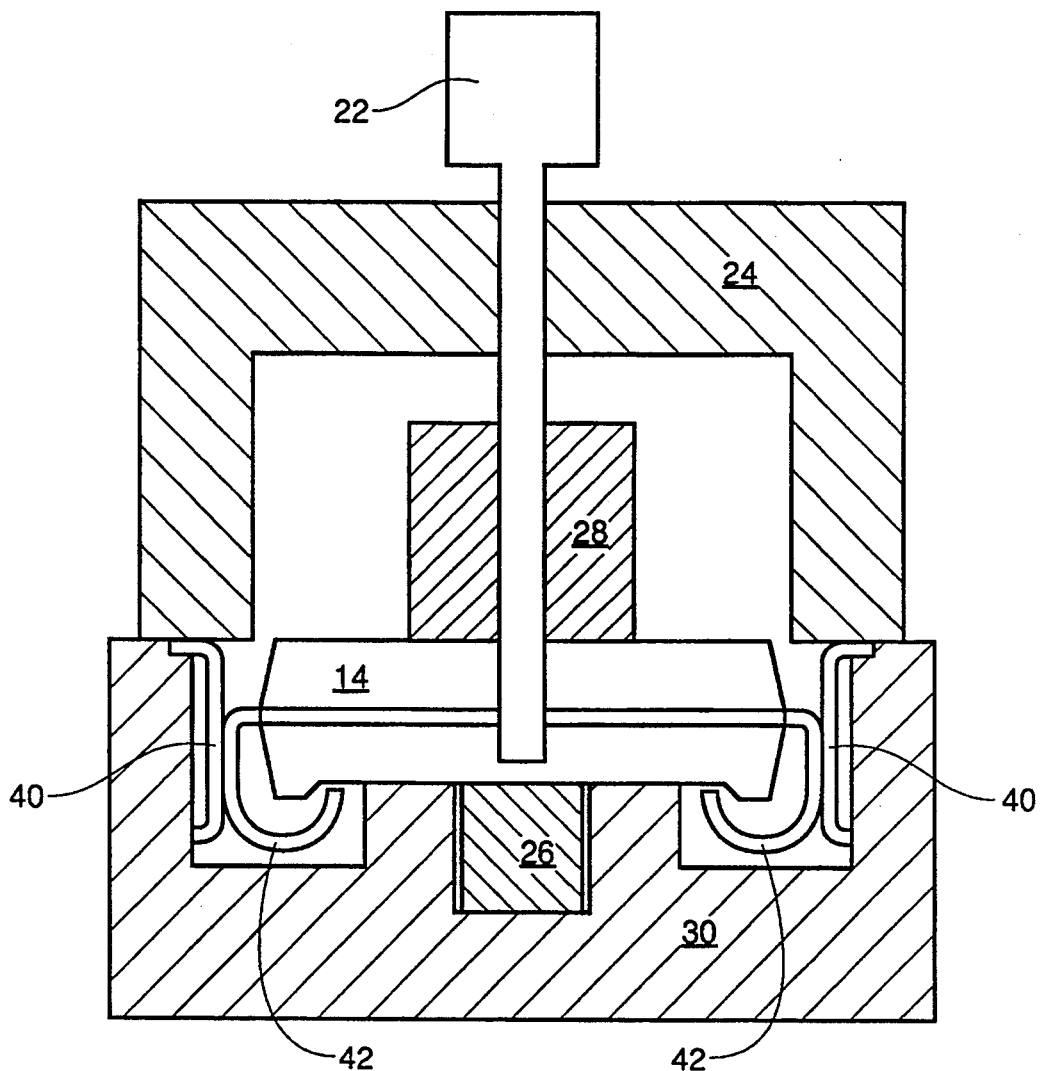
FIG. 4 is another detailed illustration of the invention.

Referring to FIGS. 3 and 4, there are sectional views of the DUT station in an upper and lower position. Further illustrated are the IC J shaped leads 42, and the insertion of the leads into the test sockets 30 and contacting the test contacts 40.

It is noted that the testing device 11 can test a whole series of ICs in a parallel process, using side by side testing device stations.

It is further noted that there are only certain test that can be performed in a typically short period of time. With the short cycle of the testing, the testing may keep pace with the ICs that are being singulated at a similarly fast rate.

In particular, there are several typical testing procedures that will identify gross IC errors. For example, open and shorts are easily tested for by loading data onto a diagonal in the memory array or performing other parametric testing. This will test for the proper function of each column and row of the device (IC). Other test check for proper current at both lower and higher levels.

As a result, there are many defects that can be identified in a very short test cycle. Specifically, electro static discharge damage, massive array failures, full row/column failures, physically scratched die, blanks (where there is no die in the encapsulated IC), improper wire bonding to the die, and IC lead/pin failures, to name a few.

There are several obvious variations to the broad invention and thus come within the scope of the present invention. Uniquely, this invention may work with any type of IC; like Js, DIPs, or ZIPs, etc. However, the test cite station 18 parts will obviously have to be changed to accommodate for the various IC shapes. These changes would be easy for one skilled in the art.

Additionally, another variation of the invention would involve the way the ICs are loaded into the testing cite 18. One form would involve using robotic pick and place technology. Another form could use a conveyor belt to collect the ICs from the singulation stations and to load into the testing device. Of course with these alternative technologies, the testing device would not have to be angled to use the gravity type feeding used in the illustrated embodiment of the invention.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Patent is:

1. An integrated circuit testing apparatus for testing an integrated circuit leaving an IC singulation station, comprising:
   a) a receiving means positioned in a pre test position for receiving the integrated circuit from the IC singulation station;
   b) a testing site, positioned to secure the integrated circuit after a displacement of said receiving means to a test position, the displacement positioning said integrated circuit in said testing site said test site having a test connection for making physical contact with said integrated circuit when it is secured in said testing site, a circuit test performed on said integrated circuit when it is secured in said testing site; and
   c) a holding station having a first post test position and a second post test position, said holding station receiving the integrated circuit in said first post test position from the receiving means following a return of the receiving means to said pre test position subsequent to the performing of the circuit test the integrated circuit;
   d) a first track for receiving the integrated circuit from the holding station when the holding station is in said first post test position and when the circuit test determines that the integrated circuit has a first test condition: and
   e) a second track for receiving the integrated circuit from the holding station when the holding station is in said second post test position, said second test position attained when said receiving means returns to said test position, said second track receiving the integrated circuit when the circuit test determines that the integrated circuit has a second test condition.

2. The apparatus of claim 1, wherein the holding station further comprises:
   a control pin for retaining the integrated circuit in the first post test position, when the integrated circuit has said second test condition, and for releasing the integrated circuit from the first post test position to said first track when said integrated circuit has said first test condition, and for releasing said integrated circuit from said second post test position to said second track when said integrated circuit has said second test condition.

3. A method for testing an integrated circuit in a testing apparatus after a departure of the integrated circuit from an integrated circuit singulation apparatus comprising the steps of:
   a) moving the testing apparatus to a loading position;
   b) loading the integrated circuit into the testing apparatus;
   c) moving the testing apparatus to a test position to position the integrated circuit for testing;
   d) performing electrical tests on the integrated circuit to provide a tested integrated circuit having identified first and second test conditions;
   e) moving the testing apparatus from the test position to position the tested integrated circuit for unloading;
   f) moving the tested integrated circuit to a first unloading position;
   g) unloading the tested integrated circuit from the first unloading position to a first track when it has said first test condition;

h) moving the tested integrated circuit to a second unloading position when it has said second test condition; and i) unloading the tested integrated circuit from the second unloading position to a second track when it has said second test condition.

4. The method as specified in claim 3, further comprising moving said testing apparatus to said test position during said step of moving the tested integrated circuit to said second unloading position.

5. A testing apparatus for controlling positioning of a circuit before, during and after a circuit test is performed on the circuit, the circuit test determining first and a second test condition of the circuit, the apparatus comprising:

a) a positioning apparatus having a first port and a second port and capable of displacement to a first position and a second position, said first port receiving the circuit for testing;

b) a testing apparatus for securing said circuit during a testing of the circuit, said positioning apparatus displaced to said second position during the testing;

c) a testing control pin for retaining said circuit in said first port prior to the testing and for allowing a transfer of said circuit from said first port to said second port subsequent to the testing;

d) a first track for receiving said circuit from said second port when said circuit test finds said circuit to have the first test condition, said positioning apparatus being in said first position; and e) a second track for receiving said circuit from said second port when said circuit test finds said circuit to have the second test condition, said positioning apparatus being in said second position.

6. The apparatus as specified in claim 5, further comprising an unloading control pin for retaining said circuit in said second port when said circuit test finds said circuit to have said second test condition and said testing apparatus is in said first position and for allowing a release of said circuit to said first track when said circuit test finds said circuit to have said first test condition and for allowing a release of said circuit to said second track when said circuit test finds said circuit to have said second test condition.

* * * * *